(12) United States Patent
Choi et al.

(10) Patent No.: US 11,960,319 B2
(45) Date of Patent: Apr. 16, 2024

(54) MEMORY DEVICE WITH REAL-TIME MONITORING

(71) Applicant: Samsung Electronics Co., Ltd., Suwon-si (KR)

(72) Inventors: Tae Min Choi, Seoul (KR); Chan Ho Lee, Hwaseong-si (KR); Jung Hak Song, Yongin-si (KR); Ju Chang Lee, Suwon-si (KR); Woo Jin Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 17/678,117

(22) Filed: Feb. 23, 2022

(65) Prior Publication Data

US 2022/0350362 A1    Nov. 3, 2022

(30) Foreign Application Priority Data

Apr. 30, 2021   (KR) .......................... 10-2021-0056551

(51) Int. Cl.
*G06F 1/06* (2006.01)
*G11C 11/41* (2006.01)

(52) U.S. Cl.
CPC ................ *G06F 1/06* (2013.01); *G11C 11/41* (2013.01)

(58) Field of Classification Search
CPC .... G06F 1/06; G06F 11/3037; G06F 11/3065; G06F 3/0614; G06F 3/0653; G11C 11/41; G11C 11/419; G11C 11/417; G11C 11/413; G11C 7/222; G11C 7/109; G11C 8/18; G11C 7/22
See application file for complete search history.

(56) References Cited

U.S. PATENT DOCUMENTS

| | | | |
|---|---|---|---|
| 7,076,709 B2 | 7/2006 | Vermeulen et al. | |
| 7,177,966 B2 | 2/2007 | Shingaki | |
| 7,216,262 B2 | 5/2007 | Martinez | |
| 7,376,039 B2 | 5/2008 | Choi et al. | |
| 7,389,373 B2 | 6/2008 | Birsan | |
| 7,961,530 B2 | 6/2011 | Kuroki et al. | |
| 8,407,544 B2 | 3/2013 | Majumdar et al. | |
| 8,464,087 B2 | 6/2013 | Kim et al. | |
| 9,915,933 B2 | 3/2018 | Kim | |
| 10,146,657 B2 | 12/2018 | Swanson et al. | |
| 10,310,761 B2 | 6/2019 | Ql et al. | |
| 10,424,346 B2 | 9/2019 | Seo et al. | |
| 10,599,540 B2 | 3/2020 | Choi et al. | |
| 10,993,647 B2 * | 5/2021 | Kale | ......................... A61B 5/18 |
| 2008/0155170 A1 | 6/2008 | Jahan et al. | |

(Continued)

FOREIGN PATENT DOCUMENTS

JP   2012003792 A   1/2012

*Primary Examiner* — Sultana Begum
(74) *Attorney, Agent, or Firm* — Myers Bigel, P.A.

(57) ABSTRACT

A memory device is provided. The memory device comprises an internal clock generator configured to receive an external clock signal from a host and generate an internal clock signal in accordance with a chip enable signal, an internal enable signal generator configured to operate based on the internal clock signal and receive an external enable signal from the host and generate an internal enable signal, and a monitoring signal generator configured to output a monitoring signal that is generated based on at least one of the internal clock signal or the internal enable signal to the host.

18 Claims, 8 Drawing Sheets

(56) References Cited

U.S. PATENT DOCUMENTS

| | | |
|---|---|---|
| 2011/0239062 A1* | 9/2011 | Noda ................ G11C 29/1201 |
| | | 714/718 |
| 2016/0170831 A1 | 6/2016 | Lesartre et al. |
| 2018/0074126 A1 | 3/2018 | Zafar et al. |
| 2019/0121558 A1 | 4/2019 | Lee et al. |
| 2020/0110883 A1 | 4/2020 | Cho |
| 2020/0387423 A1 | 12/2020 | Chen et al. |

* cited by examiner

MEMORY DEVICE WITH REAL-TIME MONITORING

CROSS-REFERENCE TO RELATED APPLICATION

This application claims priority from Korean Patent Application No. 10-2021-0056551 filed on Apr. 30, 2021 in the Korean Intellectual Property Office, the subject matter of which is hereby incorporated by reference.

FIELD

The present invention relates to a memory devices, and more specifically, to static random access memory (SRAM) devices.

BACKGROUND

A processor may be configured to execute various instructions or objects, such as firmware, operating systems, and applications, and to control peripheral devices. An operating memory may store intermediate results according to arithmetic operations when the processor operates.

A random access memory (RAM) may be used as the operating memory. The RAM may be volatile or non-volatile. A volatile RAM may not retain information stored in a volatile random access memory when power is removed, while a non-volatile random access memory may maintain memory contents of the non-volatile random access memory even when power is removed from the memory.

In the case of an automotive device, reliability is desired for the operation and control of individual devices. In the case of a processor and an operating memory installed in the automotive device, there may be demands for not only processing speed, but also data accuracy and malfunction management.

SUMMARY

Aspects of the present invention provide a memory device capable of monitoring a command processing status of a host in real time.

Aspects of the present invention also provide an electronic device and an automotive device that monitor a malfunction of a memory device.

Some embodiments of the present invention provide a memory device comprising an internal clock generator configured to generate an internal clock signal based on an external clock signal received from a host and responsive to a chip enable signal; an internal enable signal generator configured to operate based on the internal clock signal, and configured to generate an internal enable signal based on an external enable signal received from the host; and a monitoring signal generator configured to generate a monitoring signal based on at least one of the internal clock signal or the internal enable signal, and configured to output the monitoring signal to the host.

Some embodiments of the present invention provides an electronic device comprising a host configured to output an external clock signal, a chip enable signal, and at least one external enable signal; and a memory device configured to operate responsive to the external clock signal and the chip enable signal, and configured to generate an internal enable signal based on the at least one external enable signal. The memory device is configured to generate and output a monitoring signal that indicates whether the memory device is operating under control of the host.

Some embodiments of the present invention provides an automotive device comprising an automotive processor configured to output a target address, data, an external clock signal, a chip enable signal, and at least one external enable signal; and a processor embedded memory configured to operate responsive to the external clock signal and the chip enable signal, generate an internal enable signal based on the at least one external enable signal, and perform a data access operation based on the target address. The processor embedded memory is configured to generate and output a monitoring signal comprising a real-time operating status responsive to the chip enable signal and the at least one external enable signal.

However, aspects of the present invention are not restricted to those set forth herein. The above and other aspects of the present invention will become more apparent to one of ordinary skill in the art to which the present invention pertains by referencing the detailed description of the present invention given below.

DETAILED DESCRIPTION OF EMBODIMENTS

Hereinafter, an embodiment of the present disclosure will be described in more detail referring to the accompanying drawings.

Figure 1:
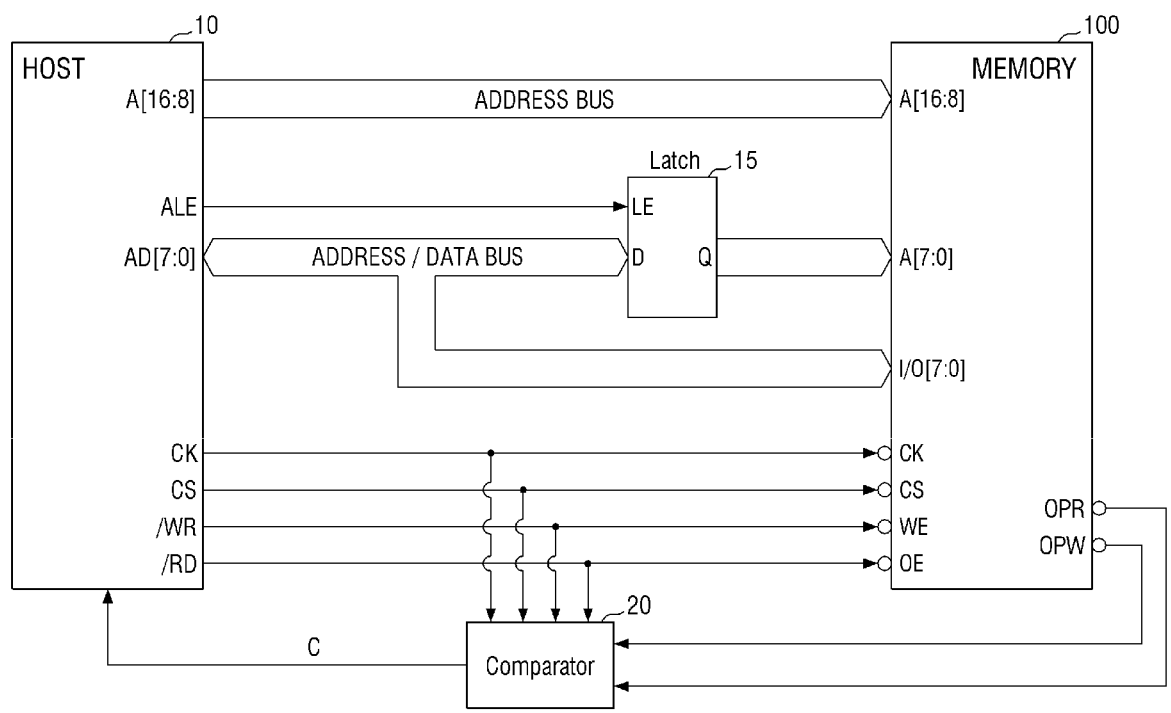
FIG. 1 shows a host and a memory device according to an embodiment of the present invention.
Figure 2:
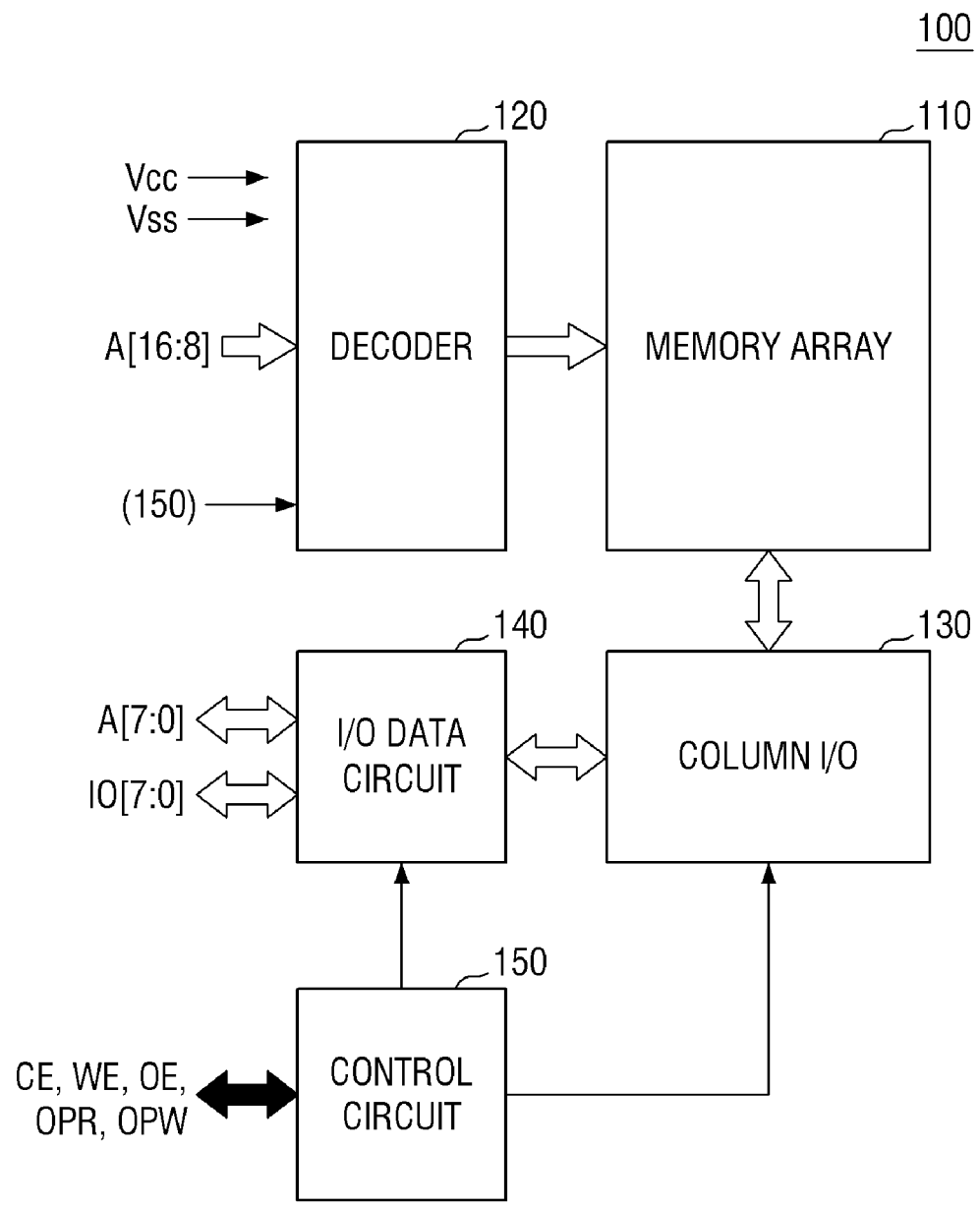
FIG. 2 shows the memory device shown in FIG. 1 in greater detail.

FIG. 1 shows a host and a memory device according to an embodiment of the present invention, and FIG. 2 specifically shows the memory device shown in FIG. 1.

Referring to FIG. 1, the host 10 is connected to the memory device 100 to control overall data access operations of the memory device 100. The data access operation includes, for example, operations of writing data on the memory device 100, reading or deleting the data stored in the memory device 100. The memory device 100 may, for example, be separate from the host 10 and electrically connected thereto (e.g., in respective electrically connected devices), and as another example, the memory device 100 may be included and embedded in the host 10 (e.g., in a single device or unit).

The host 10 may be a data processing device implemented as hardware which has a circuit having a physical structure for performing desired operations. For example, the desired operations may include codes or instructions included in the program. For example, the data processing device implemented as hardware may include a microprocessor, a central processing unit, a processor core, a multi-core processor, a main processor unit, a multiprocessor, a neural processor, an automotive processor, an ASIC (Application-Specific Integrated Circuit), and/or an FPGA (Field Programmable Gate Array).

The host 10 executes computer-readable code (e.g., software) stored in the memory device (e.g., a non-volatile memory (not shown)) and instructions induced by the host 10.

The memory device 100 may be, for example, an SRAM (Static Random Access Memory), and an embodiment in which the memory device 100 is an SRAM will be mainly described below. However, the present invention is not limited thereto, and the memory device 100 may be another non-volatile memory device other than SRAM.

The host 10 and the memory device 100 transmit and receive signals through a plurality of pins. The memory device 100 may include first to sixth pins A[16:8], peripheral pins CK, CS, WE and OE, and monitoring pins OPR and OPW as shown. The terms "first," "second," etc. may be used herein merely to distinguish one element or listed item from another.

The first to sixth pins A[16:8] may transmit and receive target addresses and data between the host 10 and the memory device 100. For example, first to eighth pins A[16:8] may transmit and receive a first target address, and ninth to sixteenth pins AD[7:0] may transmit and receive data or a second target address. For example, the first target address may be a row address of a target position to be accessed, and the second target address may be a column address of the target position to be accessed. Alternatively, the first target address may be a column address of the target position to be accessed, and the second target address may be a row address of the target position to be accessed.

A latch circuit 15 may be further included between the host 10 and the memory device 100. The latch circuit 15 may be connected differently depending on an address latch enable (ALE) signal from the host 10. For example, when the ALE signal is enabled, the signal received on the ninth to sixteenth pins AD[7:0] of the host 10 is considered as command or address, and may be transmitted to the A[7:0] of the memory device 100. When the ALE signal is disabled, the signal is considered as data, and may be transmitted to an I/O pin I/O[7:0] of the memory device 100, or data output from the I/O pin I/O[7:0] of the memory device 100 may be transmitted to the pin AD[7:0] of the host 10.

The host 10 may provide a clock signal (CK, hereinafter, an external clock signal) to the memory device 100.

The host 10 may output at least one external enable signal, for example, a chip enable signal (Chip Select, CS), a write enable signal (/WR), and a read enable signal (/RD) to the peripheral pins 100 (a chip enable pin CK, a write enable pin WE, and a read enable pin (output enable signal) OE) of the memory device 100.

In an example embodiment, the write enable signal WE maintains a static status (e.g., high or low level) and, then may be toggled between high and low levels. For example, the write enable signal WE may be toggled in an interval in which the command CMD or the address ADDR is transmitted. Accordingly, the memory device 100 may acquire the command CMD or the address ADDR on the basis of the toggle timings of the write enable signal WE.

In a data DATA output operation of the memory device 100, the memory device 100 may receive a toggling read enable signal (/RD) before outputting the data DATA. For example, the memory device 100 may transmit a data signal DQ on the basis of the toggling of the read enable signal (/RD).

The memory device 100 may output monitoring signals OPR and OPW. The monitoring signals are signals of at least one bit that are output from at least one pin. In some embodiments, a read monitoring signal OPR and a write monitoring signal OPW may be sequentially output from the one pin by at least two bits of a predetermined sequence. In some embodiments, the read monitoring signal OPR and the write monitoring signal OPW may be output from the two pins, respectively.

A comparator 20 receives a clock signal and control signals CK, CS, WE and OE that are output from the host 10 to the memory device 100, and monitoring signals OPR and OPW that are output from the memory device 100. The output signal of the host 10 is compared with the monitoring signal of the memory device 100 to monitor whether the operation of the memory device 100 is normal in real time, and a comparison result C is transmitted to the host 10. A specific description of the operation of the comparator 20 will be provided referring to FIGS. 5 and 6.

Referring to FIG. 2, the memory device 100 of FIG. 1 includes a memory cell array 110, a row decoder 120, a column I/O unit 130, and an I/O data circuit 140, and a control circuit 150.

The memory cell array 110 includes a plurality of memory cells, and the operation data of the host 10 is written on the memory cells, or the data stored in the memory cells are read or deleted.

The control circuit 150 controls the overall operations of the memory device 100. For example, the control circuit 150 receives the external enable signals CS, WE and OE, and controls operations of each of the row decoder 120, the column I/O unit 130, and the I/O data circuit 140.

The row decoder 120 receives an address from the host 10 through first to eighth pins A[16:8], and enables the target row address of the memory cell array 110 in accordance with the internal enable signal of the control circuit 150.

The I/O data circuit 140 transmits and receives commands, addresses or data transmitted and received through the ninth to sixteenth pins A[7:0] or the I/O pin IO[7:0] to and from the control circuit 150 or the column I/O unit 130.

As an example, the column I/O unit 130 may write data received from the I/O data circuit 140 on at least one memory cell of the memory cell array 110 in accordance with the internal enable signal. Alternatively, the column I/O unit 130 may read data from the memory cell of the target address and output the data to the I/O data circuit 140 in accordance with the internal enable signal as an example. Alternatively, the column I/O unit 130 may delete the data of the memory cell of the target address in accordance with the internal enable signal as an example.

Figure 3:
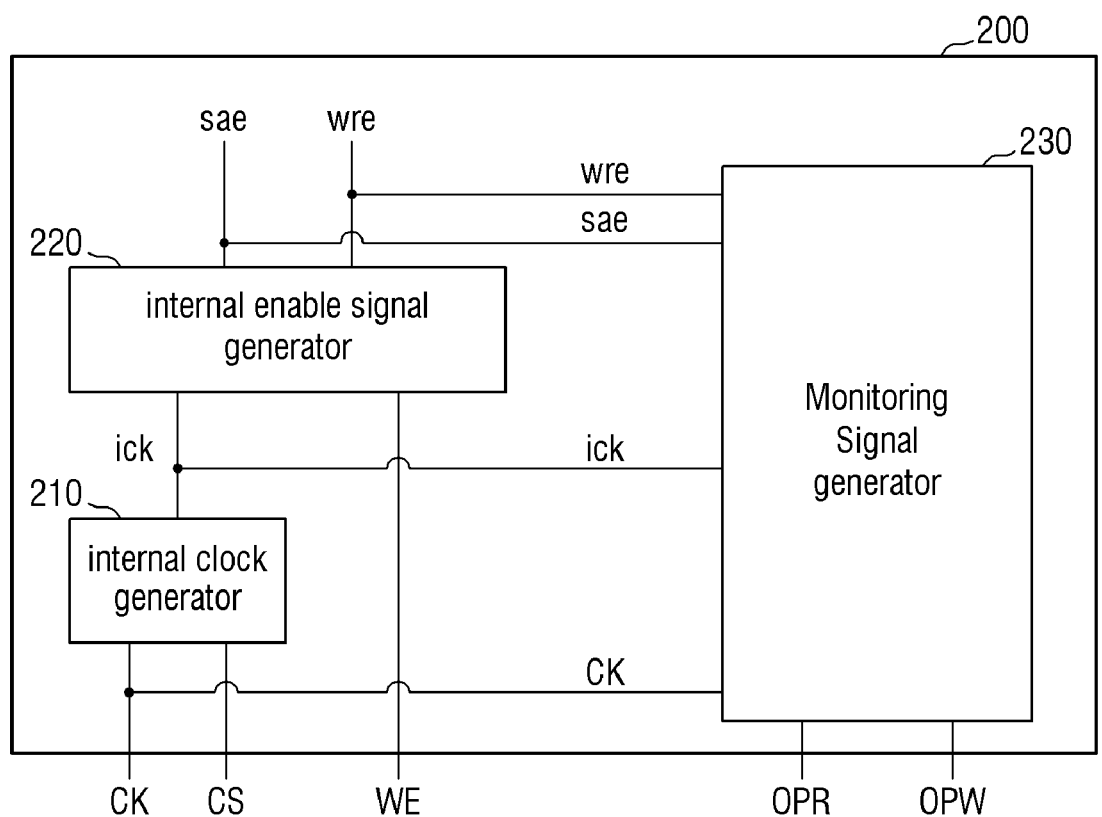
FIG. 3 shows an embodiment of the memory device shown in FIG. 1.

FIG. 3 shows an embodiment of the memory device shown in FIG. 1.

A memory device 200 of FIG. 3 may include an internal clock generator 210, an internal enable signal generator 220, and a monitoring signal generator 230 according to some embodiments.

Each configuration in the memory device 200 of FIG. 3 may be included in the memory device 100 of FIG. 2. For example, the internal clock generator 210, the internal enable signal generator 220, and the monitoring signal generator 230 may each be included in the control circuit 150. Alternatively, as another example, the internal clock generator 210 is included separately from each of the configurations or circuits 110 to 150 of FIG. 2, and each of the internal enable signal generator 220 and the monitoring signal generator 230 may be included in the control circuit 150. Alternatively, as still another example, each of the internal clock generator 210, the internal enable signal generator 200, and the monitoring signal generator 230 may be included in the memory device, separately from each of the configurations or circuits 110 to 150 of FIG. 2.

The internal clock generator 210 receives the chip enable signal CS and the external clock signal CK to generate an internal clock signal (ick). The internal clock signal (ick) is generated on the basis of the external clock signal CK only when the chip enable signal CS is enabled. As an example, the internal clock signal (ick) may have the same frequency as the external clock signal CK, and may have a multiple or different frequency as compared with the external clock signal CK as another example.

The internal enable signal generator 220 may receive the internal clock signal (ick) and the external enable signal to generate the internal enable signal. As an example, the internal enable signal generator 220 generates a write enable signal (/WE) received from the host 10 as an internal write enable signal (wre) which is synchronized with the internal clock signal (ick). As another example, the internal enable signal generator 220 may generate the read enable signal (/RD) received from the host 10 as an internal sense amplifier enable signal (sae) which is synchronized with the internal clock signal (ick). As described herein, a first signal that is "generated as" a second signal may refer to receiving the first signal and generating the second signal from or based on the first signal.

The internal sense amplifier enable signal (sae) is applied to each of the I/O data circuit 140 and the column I/O unit 130 of FIG. 2 so that the data of the memory cell is read and output to the I/O data circuit 140 through the column I/O unit 130.

The internal write enable signal (wre) is applied to each of the I/O data circuit 140 and the column I/O unit 130 of FIG. 2 so that the data received on the I/O data circuit 140 is written on the memory cell may through the column I/O unit 130.

The monitoring signal generator 230 receives the external clock signal CK, the internal clock signal (ick), and the internal enable signals (wre, sae) to generate and output the monitoring signals OPR and OPW. As an example, the monitoring signal generator 230 generates a monitoring signal on the basis of at least one of the internal clock signal (ick) or the internal enable signals (wre, sae). The host 10 may consecutively send a plurality of external enable signals to perform the desired operation, and the internal enable signal generator 220 generates an internal enable signal, in the received order of the external enable signals. The monitoring signal generator 230 indicates the operating status as a monitoring signal after performing all operations of the memory device 100 according to the internal enable signal, e.g., as based on the received order of the external enable signals. For example, a monitoring signal of a low level transitions to a high level. As another example, the monitoring signal may also display the operating status at an opposite logic level.

The monitoring signal generator 230 resets the monitoring signal on the basis of the external clock signal CK. As an example, when the external clock signal CK rises, the monitoring signal may be reset to a predetermined logic level. The predetermined logic level may be a low level or a high level according to various embodiments.

Figure 4:
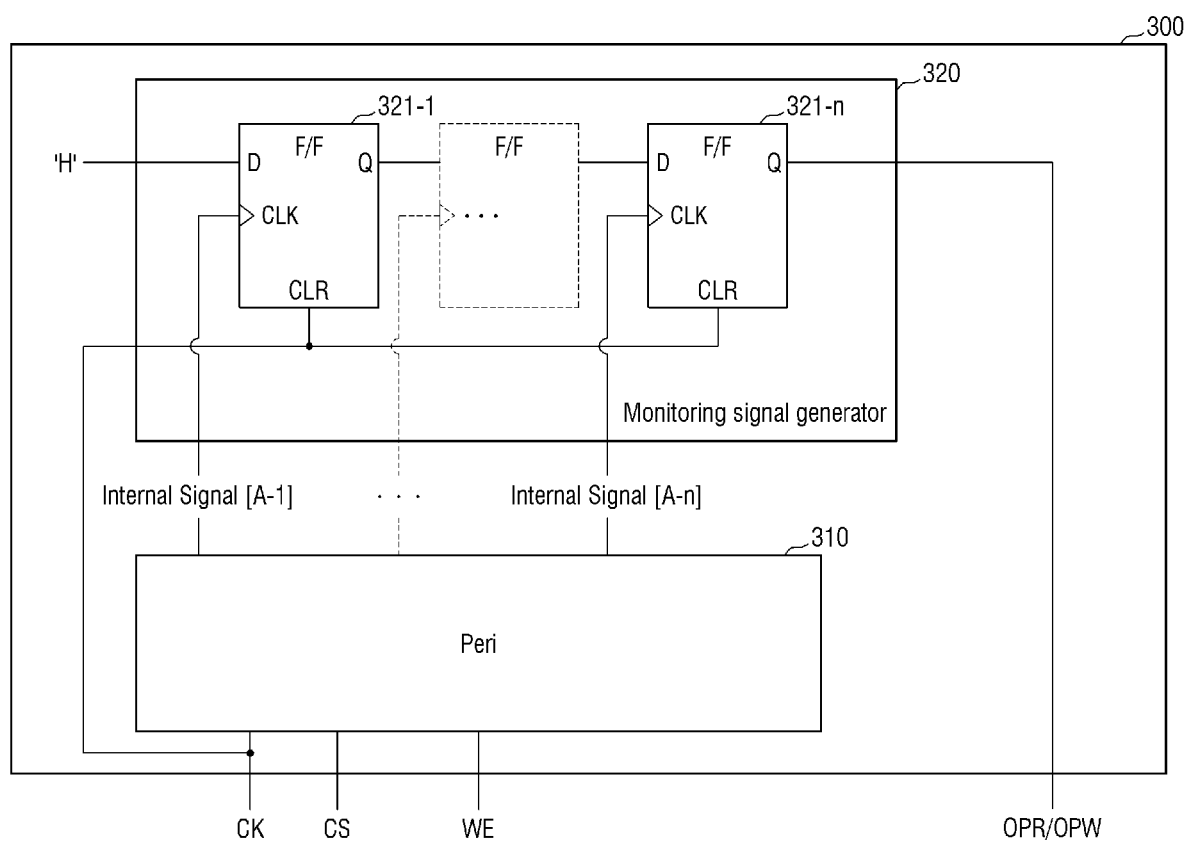
FIG. 4 shows another embodiment of the memory device shown in FIG. 1.

FIG. 4 shows another embodiment of the memory device shown in FIG. 1.

Referring to FIG. 4, the monitoring signal generator 320 may include a plurality of flip-flop circuits 321-1 to 321-n. The plurality of flip-flop circuits 321-1 to 321-n may be connected by chains or electrically chained together. That is, at least one flip-flop circuit may be connected between the input flip-flop circuit 321-1 and the output flip-flop circuit 321-n.

The expression "connected by chain" or electrically chained means that the output of the first flip-flop circuit is connected to the input of the second flip-flop circuit, and the output of the second flip-flop circuit is connected to the input of the third flip-flop circuit, also referred to as a daisy chain configuration.

Each of the flip-flop circuits 321-1 to 321-n is reset by the external clock signal CK.

When each of the flip-flop circuits 321-1 to 321-n receives an input signal D, if at least one of the internal enable signals (Internal Signals [A-1] to [An]) is applied, an output signal Q is output. Specifically, the internal enable signal A needs to rise or fall so that the input signal D received by the flip-flop circuit of the previous stage is output to the output signal Q.

When receiving the first logic signal, the input flip-flop circuit (321-1, or an initial flip-flop circuit) stores the first logic signal, and when the internal enable signal [A-1] transitions, the input flip-flop circuit sends the stored first logic signal to the next flip-flop circuit. On the same principle, when the memory device 300 operates normally, the flip-flop circuits connected by the chains sequentially generate the internal enable signal, sends the first logic signal to the next stage, and may output the first logic signal through output flip-flop circuit (321-n or a final flip-flop circuit). The output flip-flop circuit 321-n may output the output signal as a monitoring signal to the monitoring pin of the memory device 300.

Each of the plurality of flip-flop circuits receives the internal enable signals [A-1] to [A-n] and outputs the stored data to the next stage. At this time, the internal enable signals [A-1] to [A-n] are internal enable signals that are sequentially generated in the memory device 300 on the basis of the external enable signal, and are generated in the order of the external enable signals output from the host 10.

For example, when the host 10 outputs the external enable signal in the order of a first read OE1, a second read OE2, a first write WE1 and a second write WE2, the internal enable signals [A-1] to [A-n] may be generated in the order of an internal clock signal (ick), a first sense amplifier enable (sae1), a second internal sense amplifier enable (sae2), a first internal write enable (wre1), and a second internal write enable (wre2). In this case, the first logic signal H is sent to the next flip-flop in accordance with the internal clock signal (ick), and is sent from the flip-flop circuit of the previous stage to the flip-flop circuit of the next stage in accordance with signals of each of the first sense amplifier enable (sae1), the second internal sense amplifier enable (sae2), the first internal write enable (wre1) and the second internal write enable (wre2). If the memory device 300 does not operate normally, for example, if the second internal write enable (wre2) is not generated properly, the first logic signal H is not output as an output of the output flip-flop 321-n, and the signal of the predetermined basic status is output as the monitoring signal OPR/OPW.

The comparator 20 compares the monitoring signal with the signal transmitted by the host 10 to determine which operation is not normally performed. In the above example, if the signal of the predetermined basic status other than the first logic signal H is output, the comparator 20 detects this as a malfunction and may transmit the comparison result signal C to the host 10.

Figure 5:
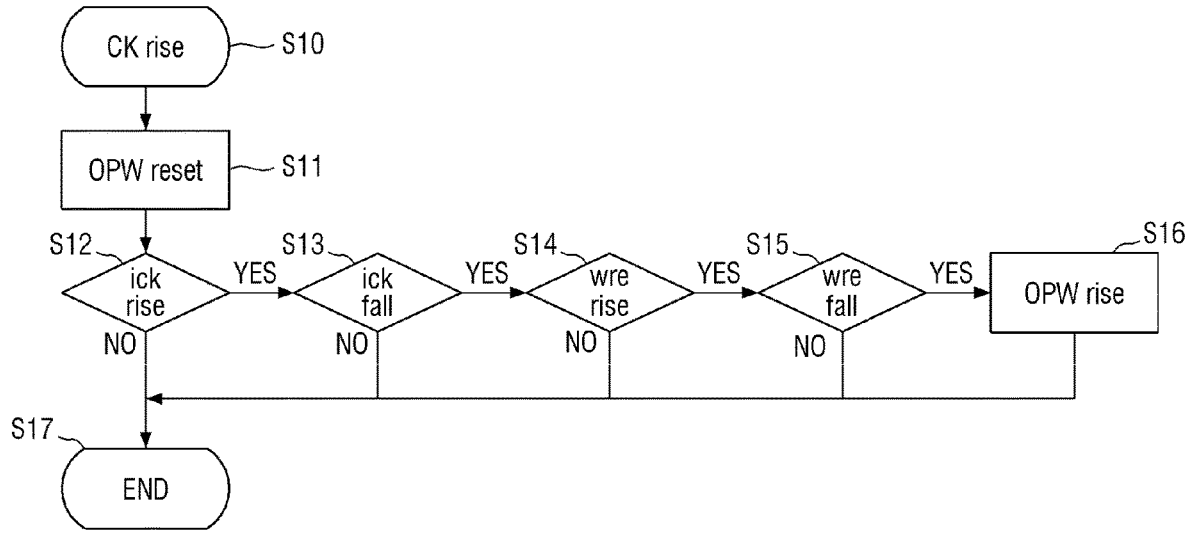
FIG. 5 is a flowchart for explaining an operating method of the monitoring signal generator shown in FIG. 2.

FIG. 5 is a flowchart for explaining an operating method of the monitoring signal generator shown in FIG. 2.

Referring to FIGS. 4 and 5, when the external clock signal CK rises from the low level to the high level (S10), the monitoring signal generator 230 resets all the plurality of flip-flop circuits 321-1 to 321-n to reset the monitoring signal OPW to the predetermined basic status (for example, a low level) (S11).

When the chip enable signal CS is enabled, the internal clock signal (ick) is output, and the internal clock signal (ick) rises from a low level to a high level (S12), the input flip-flop circuit 321-1 sends the first input logic signal H which is input initially to the next flip-flop circuit 321-2. When the internal clock signal (ick) falls from a high level to a low level (S13), the flip-flop circuit 321-2 sends the stored first logic signal H to the flip-flop circuit 321-3. When the internal write enable signal (wre) is enabled (rises) (S14), the flip-flop circuit 321-3 sends the stored first logic signal H to the final flip-flop circuit 321-4. When the internal write enable signal (wre) falls (S15), the final flip-flop circuit 321-4 outputs the stored first logic signal H to or as the monitoring signal OPW in the final flip-flop circuit 321-4 (S16) and operations end (S17).

On the other hand, in a case where the chip enable signal CS is not enabled and the internal clock signal does not fall (S13, No) or the internal write enable signal (wre) does not rise (S14, No) or does not fall (S15, No), the memory device 200 does not operate properly on the write enable signal WE or the chip enable signal CS, and the first logic signal is not sent and output to the monitoring signal OPW, and the monitoring signal OPW may be output according to the predetermined basic status (a level opposite to the first logic signal) after resetting.

Figure 6:
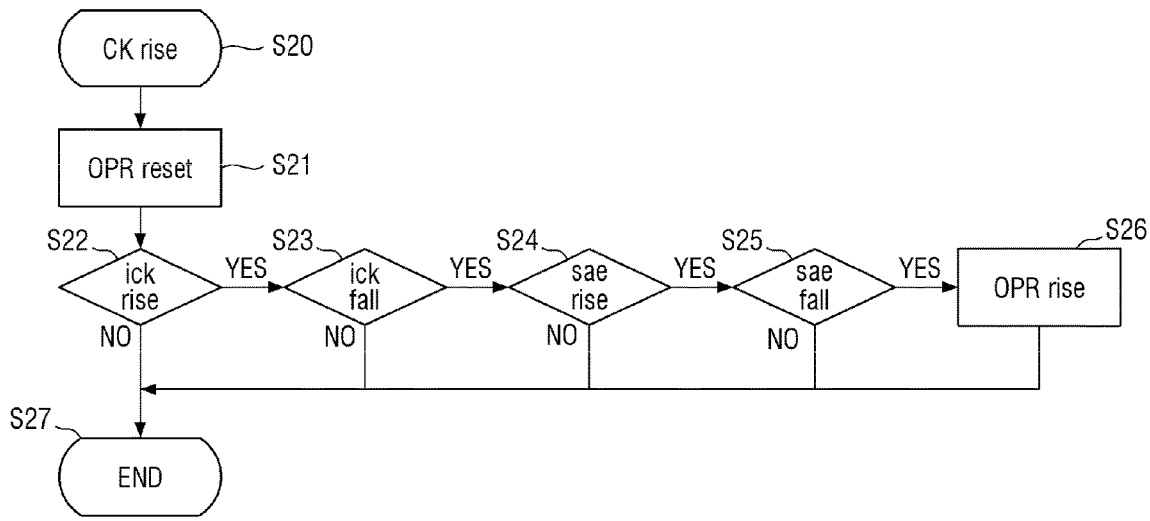
FIG. 6 is a flowchart for explaining the operating method of the monitoring signal generator shown in FIG. 2.

FIG. 6 is a flowchart for explaining the operating method of the monitoring signal generator shown in FIG. 2.

Referring to FIGS. 4 and 6, when the external clock signal CK rises from a low level to a high level (S10), the monitoring signal generator 230 resets all the plurality of flip-flop circuits 321-1 to 321-n to reset the monitoring signal OPR to the predetermined basic status (for example, a low level) (S21).

When the chip enable signal CS is enabled, the internal clock signal (ick) is output, and the internal clock signal (ick) rises from a low level to a high level (S22), the input flip-flop circuit 321-1 sends the first input first logic signal H which is initially input to the next flip-flop circuit 321-2. When the internal clock signal (ick) falls from a high level to a low level (S13), the input flip-flop circuit 321-2 sends the stored first logic signal H to the flip-flop circuit 321-3. When the sense amplifier enable signal (sae) is enabled (rises) (S24), the flip-flop circuit 321-3 sends the stored first logic signal H to the final flip-flop circuit 321-4. When the sense amplifier enable signal (sae) falls (S25), the final flip-flop circuit 321-4 outputs the stored first logic signal H to the monitoring signal OPR in the final flip-flop circuit 321-4 (S26) and operations end (S27).

On the other hand, in a case where the chip enable signal CS is not enabled and the internal clock signal does not fall (S23, No) or the sense amplifier enable signal (sae) does not rise (S24, No) or does not fall (S25, No), the memory device 200 does not operate properly on the read enable signal RD or the chip enable signal CS, the first logic signal is not sent and output to the monitoring signal OPW, and the monitoring signal OPW may be output according to the predetermined basic status (a level opposite to the first logic signal) after resetting.

Figure 7:
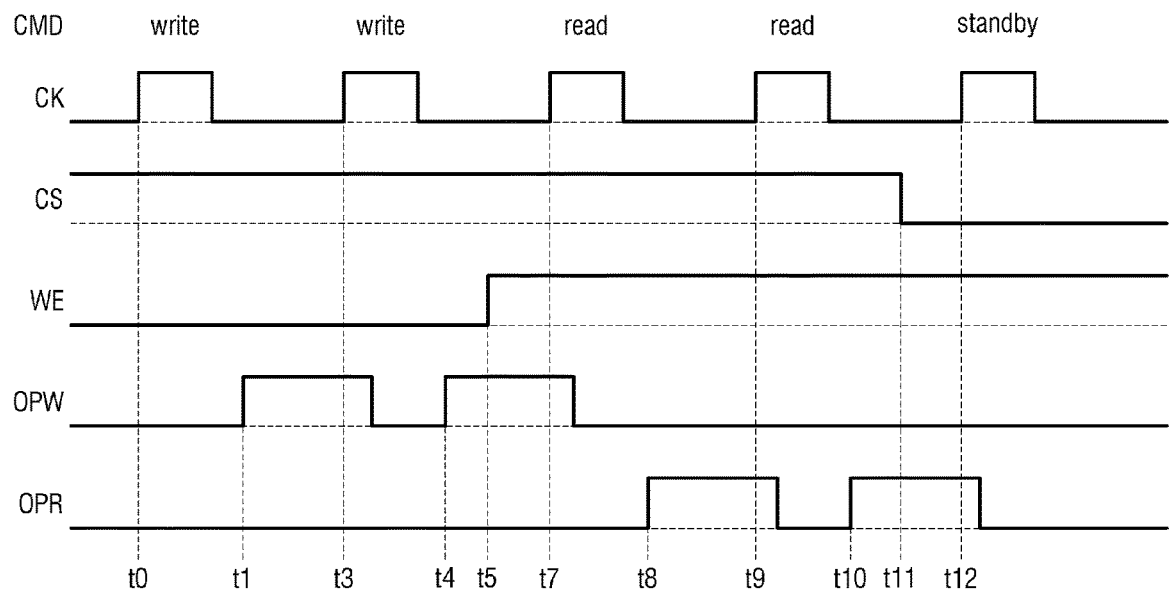
FIG. 7 is an operation timing diagram when the memory device shown in FIG. 1 operates normally.
Figure 8:
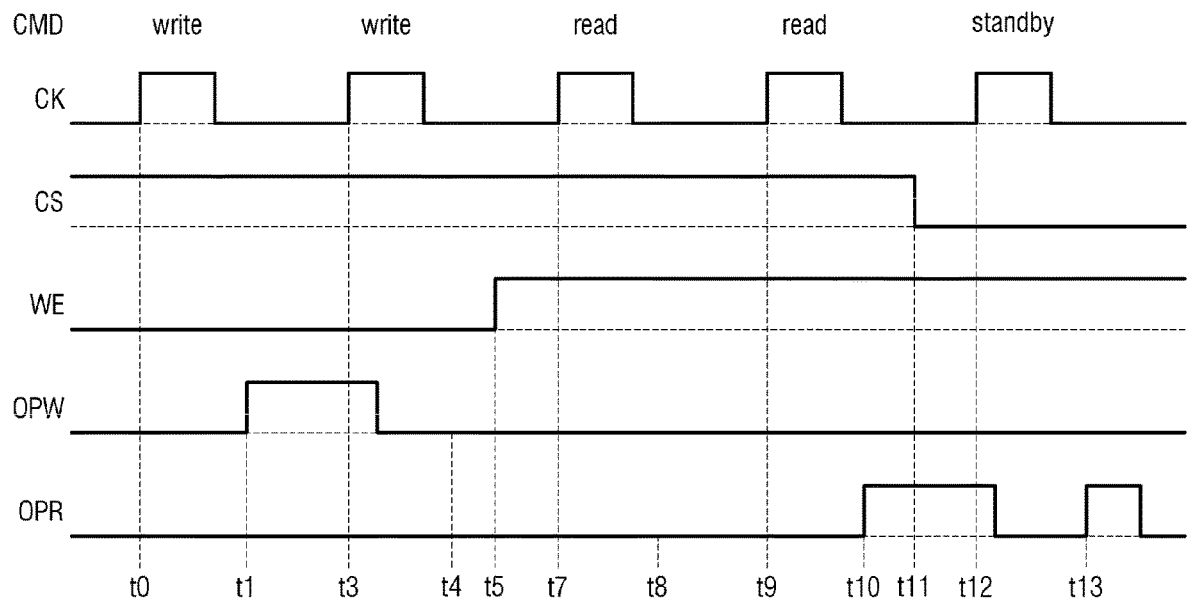
FIG. 8 is an operation timing diagram when the memory device shown in FIG. 1 malfunctions.

FIG. 7 is an operation timing diagram when the memory device shown in FIG. 1 operates normally, and FIG. 8 is an operation timing diagram when the memory device shown in FIG. 1 malfunctions.

In FIGS. 7 and 8, assume that a first write, a second write, a first read, and a second read sequentially operates in the order of command according to some embodiments, and there is standby status after the above four operations. The memory device 200 receives an external clock signal and an external enable signal from the host 10. Specifically, in the memory device 200, the chip enable signal CS is enabled and output at a high level according to the external clock signal CK, and a write enable signal WE is output at a low level according to the first write and the second write (t0 to t5 intervals).

The monitoring signal OPW is reset and maintains a low level when the external clock signal CK rises from t0. Since the first internal write enable signal (wre) is enabled according to the first write, the monitoring signal OPW receives the first logic signal H and is output at a high level at t1. When the external clock signal CK rises at t3, the monitoring signal OPW is reset and enters a low level. When the second internal write enable signal (wre) is enabled according to the second write, the monitoring signal OPW transitions from a low level to a high level again and is output at t4. On the other hand, the write enable signal WE transitions from a low level to a high level at t5 when the write operation ends.

On the other hand, the monitoring signal OPR is reset and maintains a low level when the external clock signal CK rises at t7. When the first read is input, since the first sense amplifier enable signal (sae) is enabled according to the read enable signal RD, the monitoring signal OPR receives the first logic signal H and is output at a high level at t8. When the external clock signal CK rises at t9, the monitoring signal OPR is reset and enters a low level. When the second sense amplifier enable signal (sae) is enabled according to the second read, the monitoring signal OPR transitions from a low level to a high level again at t10, and is output.

On the other hand, when the second read operation ends and the additional external enable signal is not received, the chip enable signal CS transitions to a low level at t11, and all the monitoring signals OPR and OPW are reset at t12 which is the next rising time of the external clock signal CK.

On the other hand, a signal diagram of the memory device 200 of FIG. 8 shows a case where the command of the second write, the chip enable signal CS, and the write enable signal WE are normally output from the host 10.

Even though or even when the commands and signals output from the host 10 are output normally, since the flip-flop operation based on rising or falling of the internal write enable signal (wre) is not properly performed in the memory device 200, it may be seen that the first logic signal is not sent, and the monitoring signal OPW of the reset status (a low level) is output at t4.

Alternatively, even though or even when the commands and signals CK, CS and RD output from the host 10 are output normally, since the flip-flop operation based on rising or falling of the sense amplifier enable signal (sae) is not performed properly in the memory device 200, it may be seen that the first logic signal is not sent, and the monitoring signal OPR of the reset status (low level) is output at t8.

Alternatively, even though the chip enable signal is disabled from the host 10, it may be seen that the monitoring signal OPR output at a high level and the memory device 200 operates.

That is, the monitoring signals OPR and OPW may be compared with the signals CK, CS, WE and RD which are input to perform the intended operation on the memory device 200 by the host 10 in real-time. Accordingly, the memory device according to embodiments of the present invention may identify or indicate potential problems early, e.g., in a case where an erroneous operation is performed on the intended operation or the memory device operates voluntarily when the host does not give an operating instruction.

Figure 9:
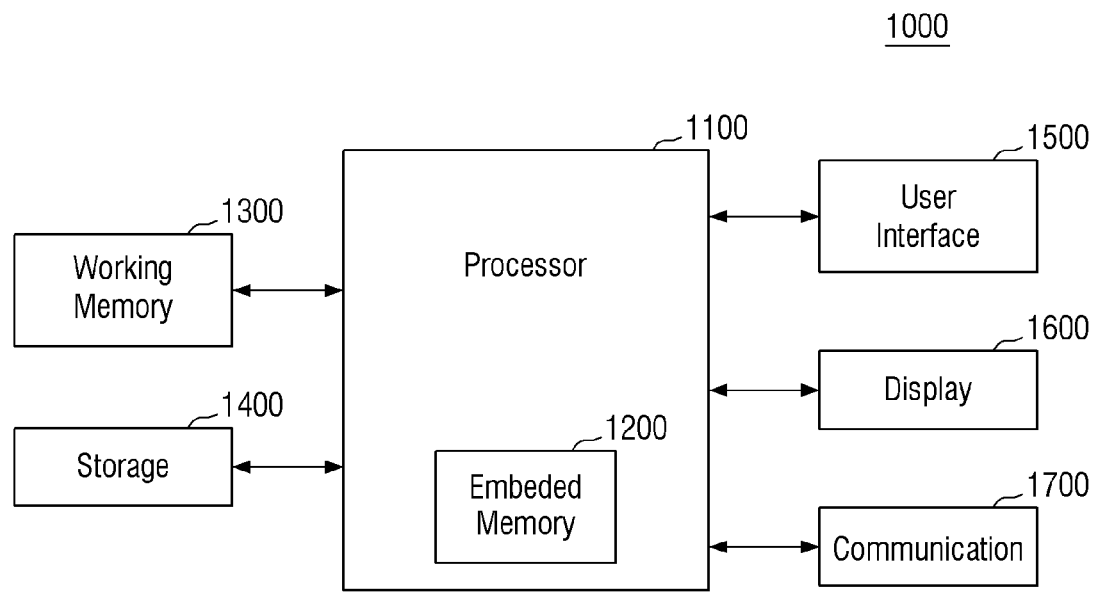
FIG. 9 shows an electronic device according to an embodiment of the present invention.

FIG. 9 shows an electronic device according to an embodiment of the present invention.

For example, the electronic device 1000 may be implemented as a smartphone, a tablet computer, a desktop computer, a laptop computer, and/or a wearable device. In addition, the electronic device 1000 may be implemented as one of various types of electronic devices that may be used to operate, for example, an unmanned security system, Internet of things, and/or an autonomous vehicle.

The electronic device 1000 may include a main processor 1100, a working memory 1300, a storage 1400, a display 1600, a communication block 1700, and a user interface 1500.

The main processor 1100 may be the host 10 described in FIGS. 1 to 8. The main processor 1100 may include an embedded memory 1200, and may also be referred to as an embedded system or processor embedded memory. The embedded memory 1200 may be the memory device 100 described in FIGS. 1 to 8.

The working memory 1300 may store data used for the operation of the electronic device 1000. For example, the working memory 1300 may temporarily store packets or frames processed by the processor 1100. For example, the working memory 1300 may include a volatile memory such as a DRAM (Dynamic RAM) or an SDRAM (Synchronous RAM), and/or a non-volatile memory such as a PRAM (Phase-change RAM), a MRAM (Magneto-resistive RAM), a ReRAM (Resistive RAM) or a FRAM (Ferro-electric RAM).

The storage 1400 may store firmware or software for performing event reward schemes. The firmware or software for performing the event reward schemes may be read from the storage 1400 and loaded into the working memory 1300 in accordance with a request or command from the main processor 1200. The storage 1400 may include a non-volatile memory such as a flash memory, a PRAM, a MRAM, a ReRAM and/or a FRAM.

The display 1600 may include a display panel and a DSI (display serial interface) peripheral circuit. For example, the display panel may be implemented as various devices such as an LCD (Liquid Crystal Display device), a LED (Light Emitting Diode) display device, an OLED (Organic LED) display device, and an AMOLED (Active Matrix OLED) display device. A DSI host equipped in the main processor 1100 may perform serial communication with the display panel through the DSI. The DSI peripheral circuit may include a timing controller, a source driver, and the like required to drive the display panel.

The communication block 1700 may exchange signals with external device/system through an antenna. A transceiver and a MODEM (Modulator/Demodulator) of the communication block may process signals exchanged with external device/system according to wireless protocol, such as LTE (Long Term Evolution), WIMAX (Worldwide Interoperability for Microwave Access), GSM (Global System for Mobile communication), CDMA (Code Division Multiple Access), Bluetooth, NFC (Near Field Communication), Wi-Fi (Wireless Fidelity), and RFID (Radio Frequency Identification).

The user interface 1500 may include at least one input interface, such as a keyboard, a mouse, a keypad, a button, a touch panel, a touch screen, a touchpad, a touchball, a gyroscope sensor, a vibration sensor, and an acceleration sensor.

The components of the electronic device 1000 may exchange data by one or more of various interface protocols, such as USB (Universal Serial Bus), SCSI (Small Computer System Interface), PCIe (Peripheral Component Interconnect Express), M-PCIe (Mobile PCIe), ATA (Advanced Technology Attachment), PATA (Parallel ATA), SATA (Serial ATA), SAS (Serial Attached SCSI), IDE (Integrated Drive Electronics), EIDE (Enhanced IDE), NVMe (Non-volatile Memory Express), and UFS (Universal Flash Storage).

Figure 10:
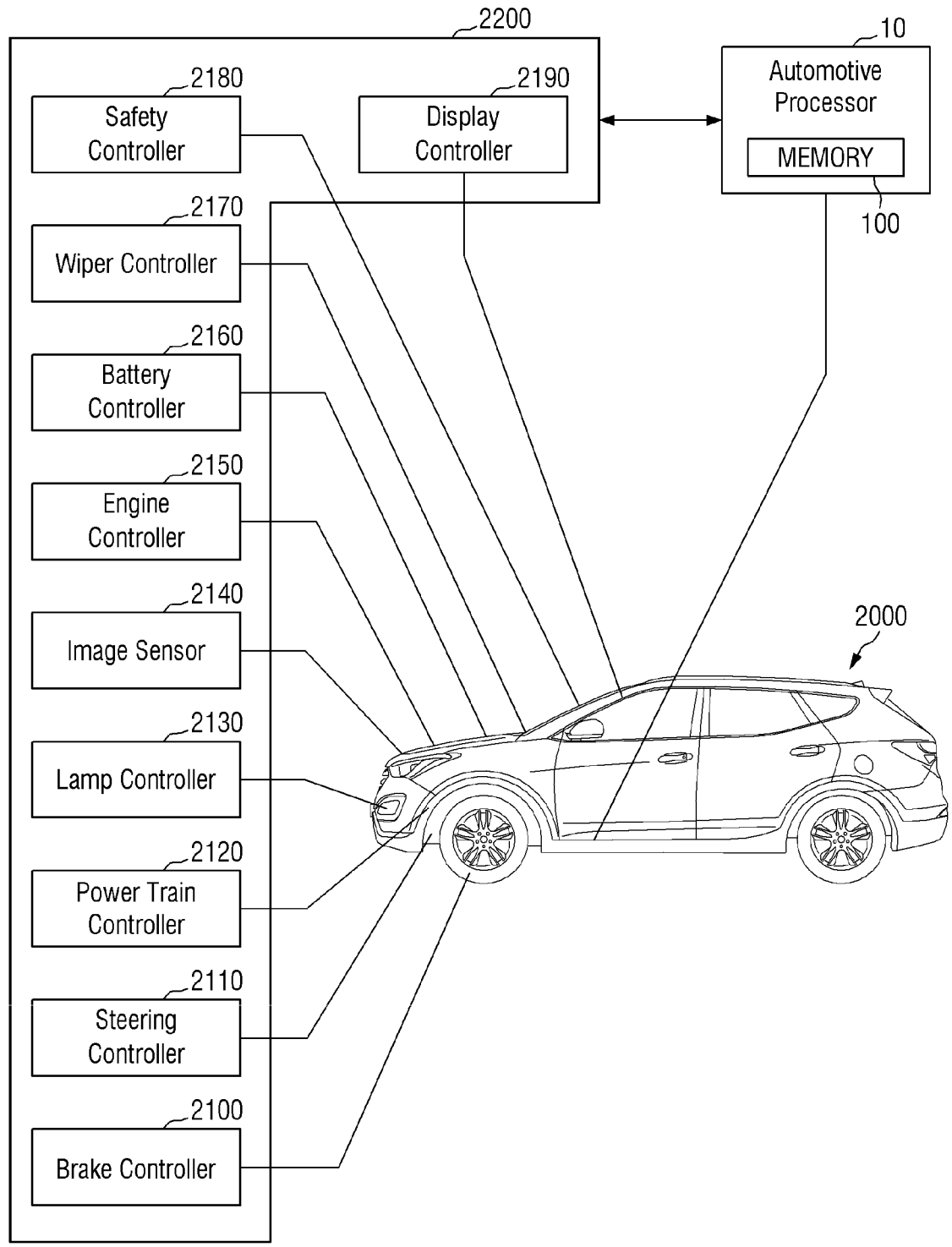
FIG. 10 shows automotive processors and automotive devices according to an embodiment of the present invention.

FIG. 10 shows automotive processors and automotive devices according to an embodiment of the present invention.

Referring to FIG. 10, an automotive device 2000 may include an automotive processor 10, a memory device 100, and other individual devices 2200. The automotive processor 10 may be the host 10 described referring to FIGS. 1 to 8.

The individual devices 2200 may include a brake controller 2100, a steering controller 2110, a power train controller 2120, a lamp controller 2130, an image sensor 2140, an engine controller 2150, a battery controller 2160, a wiper controller 2170, a safety controller 2180, and a display controller 2190.

The brake controller 2100 may include sensors that sense the status of the brake. The brake controller 2100 may transmit the detection result of the sensor to the automotive processor 10. The brake controller 2100 may further include a controller for controlling the brake. The brake controller 2100 may receive control commands from the automotive processor 10. The brake controller 2100 may control the brakes according to the control commands.

The steering controller 2110 may include sensors that sense the status of a steering machine. The steering controller 2110 may transmit the detection results of the sensors to the automotive processor 10. The steering controller 2110 may further include a controller for controlling the steering machine. The steering controller 2110 may receive control commands from the automotive processor 10 and control the steering machine according to the control commands.

Similarly, the power train controller 2120 may transmit the detection results of the sensors of the power train to the automotive processor 10. The power train controller 2120 may control the power train according to control commands from the automotive processor 10. The lamp controller 2130 may transmit the detection results of the sensors of the lamps to the automotive processor 10. The lamp controller 2130 may control the lamps according to the control commands from the automotive processor 10.

The image sensor 2140 may encode the scene within the field of view into video data and transmit the video data to the automotive processor 10. The engine controller 2150 may transmit the detection results of the sensors of the engine to the automotive processor 10. The engine controller 2150 may control the engine according to control commands from the automotive processor 10.

The battery controller 2160 may transmit information about the battery status to the automotive processor 10. The battery controller 2160 may control the battery settings according to control commands from the automotive processor 10. The wiper controller 2170 may transmit the detection results of the sensors of external environment (for example, whether it is raining) to the automotive processor 10. The wiper controller 2170 may control the wipers according to the control commands from the automotive processor 10.

The safety controller 2180 may transmit the detection results of the sensors of the safety devices such as a seat belt, an airbag, and an electronically controlled suspension (ECS) to the automotive processor 10. As another example, the safety controller 2180 may transmit the detection results of the external environment (for example, a tilt, a drop, a collision, etc.) to the automotive processor 10. The safety controller 2180 may control the safety devices according to the control commands from the automotive processor 10.

The display controller 2190 may transmit the detection results of the sensors of the external environment (for example, an illuminance, a moving speed, etc.) to the automotive processor 10. According to the control commands from the automotive processor 10, the display controller 2190 may adjust the illuminance of the display device or limit contents to be displayed.

In the embodiments described above, the components according to the embodiments of the present invention have been referred to using the terms "part", "module", or "block". The terms "part", "module", or "block" may be implemented as various hardware devices such as IC (Integrated Circuit), ASIC (Application Specific IC), FPGA (Field Programmable Gate Array), and CPLD (Complex Programmable Logic Device), firmware driven in the hardware devices, software such as applications or in a combined form of the hardware device and software. Further, the terms "part", "module", or "block" may include circuits or an IP (Intellectual Property) made up of the semiconductor elements inside the IC.

Although not individually defined in the embodiments mentioned above, the components described in the embodiments mentioned above may be implemented as various hardware devices, firmware driven in the hardware devices, software such as applications or a combined form of hardware device and software, or as IP.

In concluding the detailed description, those skilled in the art will appreciate that many variations and modifications may be made to the embodiments without substantially departing from the principles of the present invention. Therefore, the disclosed embodiments of the invention are used in a generic and descriptive sense only and not for purposes of limitation.

What is claimed is:

1. A memory device comprising:
    an internal clock generator configured to generate an internal clock signal based on an external clock signal received from a host and responsive to a chip enable signal;
    an internal enable signal generator configured to operate based on the internal clock signal, and configured to generate an internal enable signal based on an external enable signal received from the host; and
    a monitoring signal generator configured to generate a monitoring signal that indicates whether the memory device is operating under control of the host based on at least one of the internal clock signal or the internal enable signal, and configured to output the monitoring signal from the memory device,
    wherein a comparison of the monitoring signal with the external enable signal indicates, in real time, whether the internal enable signal was generated in accordance with an order in which the external enable signal was received from the host.

2. The memory device of claim 1, wherein the external enable signal is an output enable signal, and the internal enable signal is a sense amplifier enable signal.

3. The memory device of claim 1, wherein the external enable signal is a write enable signal, and the internal enable signal is an internal write enable signal.

4. The memory device of claim 1, wherein the monitoring signal generator is configured to:
    monitor whether the internal clock signal or the internal enable signal rises or falls in the order in which the external enable signal was received, and
    generate the monitoring signal based on the at least one of the internal clock signal or the internal enable signal responsive to whether the internal clock signal or the internal enable signal rises or falls in the order in which the external enable signal was received.

5. The memory device of claim 4, wherein the monitoring signal generator is configured to output a final result as the monitoring signal, after the internal clock signal or the internal enable signal rises or falls repeatedly in the order in which the external enable signal was received.

6. The memory device of claim 4, wherein the monitoring signal generator is configured to reset the monitoring signal each time the external clock signal is received.

7. The memory device of claim 1, wherein the monitoring signal generator comprises a plurality of flip-flop circuits that are electrically connected in a daisy chain configuration, and
    each of the flip-flop circuits is configured to receive one of the internal clock signal or the internal enable signal, and is configured to send a first logic signal to a next one of the flip-flop circuits in the daisy chain configuration when the one of the internal clock signal or the internal enable signal rises or falls.

8. The memory device of claim 7, wherein the monitoring signal generator is configured to reset the plurality of flip-flop circuits when the external clock signal is received by each of the flip-flop circuits.

9. An electronic device comprising:
    a host configured to output an external clock signal, a chip enable signal, and at least one external enable signal;
    a memory device configured to operate responsive to the external clock signal and the chip enable signal, and configured to generate an internal enable signal based on the at least one external enable signal, wherein the memory device is configured to generate and output a monitoring signal that indicates whether the memory device is operating under control of the host,
    wherein the memory device comprises a plurality of flip-flop circuits that are electrically connected in a daisy chain configuration, and wherein each of the flip-flop circuits is configured to receive an internal clock signal or the internal enable signal,
    wherein an initial flip-flop circuit of the daisy chain configuration is configured to output a first logic signal to a next flip-flop circuit of the daisy chain configuration in accordance with the internal clock signal, and
    a final flip-flop circuit of the daisy chain configuration is configured to output an output of a previous flip-flop circuit of the daisy chain configuration as the monitoring signal in accordance with the internal enable signal.

10. The electronic device of claim 9, further comprising a comparator configured to compare the chip enable signal and the at least one external enable signal with the monitoring signal to determine whether the memory device is operating normally.

11. The electronic device of claim 9, wherein the memory device is configured to generate an internal clock signal based on the external clock signal when the chip enable signal is enabled.

12. The electronic device of claim 11, wherein the memory device is configured to generate the internal enable signal based on the at least one external enable signal when the internal clock signal is enabled.

13. The electronic device of claim 9, wherein the plurality of flip-flop circuits are configured to be reset based on the external clock signal.

14. An automotive device comprising:
an automotive processor configured to output a target address, data, an external clock signal, a chip enable signal, and at least one external enable signal; and
a processor embedded memory configured to operate responsive to the external clock signal and the chip enable signal, generate an internal enable signal based on the at least one external enable signal, and perform a data access operation based on the target address,
wherein the processor embedded memory is configured to generate and output a monitoring signal comprising a real-time operating status responsive to the chip enable signal and the at least one external enable signal, and
wherein the processor embedded memory comprises a plurality of flip-flop circuits that are electrically connected in a daisy chain configuration, each of the flip-flop circuits is configured to receive an internal clock signal or the internal enable signal, an initial flip-flop circuit of the daisy chain configuration is configured to output a first logic signal to a next flip-flop circuit of the daisy chain configuration in accordance with the internal clock signal, and a final flip-flop circuit of the daisy chain configuration is configured to output an output of a previous flip-flop circuit of the daisy chain configuration as the monitoring signal in accordance with the internal enable signal.

15. The automotive device of claim 14, wherein the at least one external enable signal comprises a plurality of external enable signals, and responsive to consecutively receiving the plurality of external enable signals, the processor embedded memory is configured to generate the internal enable signal in accordance with a received order of the plurality of external enable signals, and
the processor embedded memory is configured to output the monitoring signal according to the internal enable signal after completion of operations according to the received order.

16. The automotive device of claim 14, wherein the internal enable signal is a sense amplifier enable signal or an internal write enable signal.

17. The automotive device of claim 16, wherein the at least one external enable signal is an output enable signal, and the internal enable signal is the sense amplifier enable signal.

18. The automotive device of claim 16, wherein the at least one external enable signal is a write enable signal, and the internal enable signal is the internal write enable signal.

* * * * *